(12) United States Patent
Williamson et al.

(10) Patent No.: US 12,278,205 B2
(45) Date of Patent: Apr. 15, 2025

(54) SEMICONDUCTOR DEVICE PACKAGE WITH IMPROVED DIE PAD AND SOLDER MASK DESIGN

(71) Applicant: Texas Instruments Incorporated, Dallas, TX (US)

(72) Inventors: Jaimal Mallory Williamson, McKinney, TX (US); Guangxu Li, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 112 days.

(21) Appl. No.: 16/778,250

(22) Filed: Jan. 31, 2020

(65) Prior Publication Data
US 2020/0251436 A1    Aug. 6, 2020

Related U.S. Application Data

(60) Provisional application No. 62/799,883, filed on Feb. 1, 2019.

(51) Int. Cl.
| | |
|---|---|
| *H01L 23/48* | (2006.01) |
| *H01L 21/48* | (2006.01) |
| *H01L 23/00* | (2006.01) |
| *H01L 21/56* | (2006.01) |
| *H01L 23/498* | (2006.01) |

(52) U.S. Cl.
CPC ............ *H01L 24/16* (2013.01); *H01L 21/481* (2013.01); *H01L 24/81* (2013.01); *H01L 21/563* (2013.01); *H01L 23/49816* (2013.01); *H01L 2224/10175* (2013.01); *H01L 2224/16227* (2013.01); *H01L 2224/81815* (2013.01)

(58) Field of Classification Search
CPC .................................................. H05K 3/3452
See application file for complete search history.

(56) References Cited

U.S. PATENT DOCUMENTS

| | | | |
|---|---|---|---|
| 8,164,003 B2* | 4/2012 | Tang | H05K 3/3452 |
| | | | 174/261 |
| 8,350,384 B2* | 1/2013 | Pendse | H01L 21/563 |
| | | | 257/734 |

(Continued)

OTHER PUBLICATIONS

Fauty et al., "Mold Compound Adhesion to Bare Copper Lead Frames-Effect of Laser Texturing", International Journal of Microcircuits and Electronic Packaging, vol. 25, No. 1, First Quarter, 2002, pp. 51-79; accessed Jan. 31, 2020, https://pdfs.semanticscholar.org/591d/e8b460260d2ef5386181ddf44d8c12b8d550.pdf?_ga=2.42811493.1964693168.1580487145-1006785256.1580487145.

*Primary Examiner* — Nicholas J Tobergte
(74) *Attorney, Agent, or Firm* — Yudong Kim; Frank D. Cimino

(57) ABSTRACT

A described example includes a package substrate having an array of die pads arranged in rows and columns on a die mount surface, and having an opposing board side surface; a solder mask layer overlying the die mount surface; a first plurality of solder mask defined openings in the solder mask layer at die pad locations, the solder mask defined openings exposing portions of a surface of corresponding die pads, the surface facing away from the package substrate; and at least one non-solder mask defined opening in the solder mask layer at a die pad location, exposing the entire surface of the die pad and sidewalls of the die pad at the non-solder mask defined opening.

25 Claims, 7 Drawing Sheets

(56) References Cited

U.S. PATENT DOCUMENTS

| | | | | |
|---|---|---|---|---|
| 8,642,384 | B2* | 2/2014 | Lee | H01L 24/27 |
| | | | | 257/781 |
| 9,117,812 | B2* | 8/2015 | Lee | H01L 23/3121 |
| 9,673,093 | B2* | 6/2017 | Hsieh | H01L 24/05 |
| 9,831,205 | B2* | 11/2017 | Chen | H01L 24/06 |
| 11,676,938 | B2* | 6/2023 | Hsieh | H01L 21/76879 |
| | | | | 257/773 |
| 2001/0000925 | A1* | 5/2001 | Caletka | H01L 23/49816 |
| | | | | 257/E21.511 |
| 2002/0070451 | A1* | 6/2002 | Burnette | H01L 23/49838 |
| | | | | 257/737 |
| 2007/0096338 | A1* | 5/2007 | Kim | H05K 3/3436 |
| | | | | 257/E23.07 |
| 2013/0107483 | A1* | 5/2013 | Jiang | H05K 1/111 |
| | | | | 361/767 |
| 2014/0376202 | A1* | 12/2014 | Shibutani | H01L 23/49811 |
| | | | | 361/767 |
| 2017/0278819 | A1* | 9/2017 | Kawamura | H01L 24/81 |

\* cited by examiner

SEMICONDUCTOR DEVICE PACKAGE WITH IMPROVED DIE PAD AND SOLDER MASK DESIGN

CROSS-REFERENCE TO RELATED APPLICATIONS

This application claims the benefit under 35 U.S.C. § 119(e) to co-owned U.S. Provisional Patent Application Ser. No. 62/799,883, filed Feb. 1, 2019, which is hereby incorporated by reference herein in its entirety.

TECHNICAL FIELD

This disclosure relates generally to semiconductor device packaging, and more particularly to flip chip semiconductor device packages having solder connections from a semiconductor die to a package substrate.

BACKGROUND

After semiconductor device die are manufactured on a semiconductor wafer by a semiconductor fabrication process, the semiconductor device dies are separated one from another to form individual die. In completing the packaged semiconductor device, flip-chip ball grid array (FCBGA) devices are formed by mounting one or more semiconductor die to a package substrate using conductive post connects that are formed on the bond pads of the semiconductor dies. A thermal reflow process is used to connect solder on the ends of the conductive post connects extending from the active surface of the semiconductor die to die pads on a package substrate. The package substrate has die pads on a die mount surface and an array of solder balls (a ball grid array) on an opposing board side surface. Mold compound or other dielectric material can be applied over the semiconductor die and at least a portion of the package substrate to form the body of the package. In alternative approaches, lids or covers can be used to cover the semiconductor die and a portion of the package substrate.

In making the connection between the semiconductor die and the package substrate, solder that at the ends of the conductive post connects is used. In a thermal reflow process, the solder is heated to a liquid or molten state and flows onto the die pads on the package substrate. The solder cools to a solid to form a solder joint that is both a mechanical attachment and an electrical connection. The die pads are exposed within openings in a solder mask layer on the die mount surface of the package substrate. Yield failures can occur when a poor solder joint, a cracked solder joint, or an open is formed on a die pad on the package substrate. Shorts can also occur between the conductive post connects when solder flows along the sides of the conductive post connects, this unwanted solder can form solder bridges between adjacent conductive post connects, shorting the posts together and causing failure of the packaged semiconductor device.

SUMMARY

A described example includes a package substrate having an array of die pads arranged in rows and columns on a die mount surface, and having an opposing board side surface; a solder mask layer overlying the die mount surface; a first plurality of solder mask defined openings in the solder mask layer at die pad locations, the solder mask defined openings exposing portions of a surface of corresponding die pads, the surface facing away from the package substrate; and at least one non-solder mask defined opening in the solder mask layer at a die pad location, exposing the entire surface of the die pad and sidewalls of the die pad at the non-solder mask defined opening.

DETAILED DESCRIPTION

Figure 1:
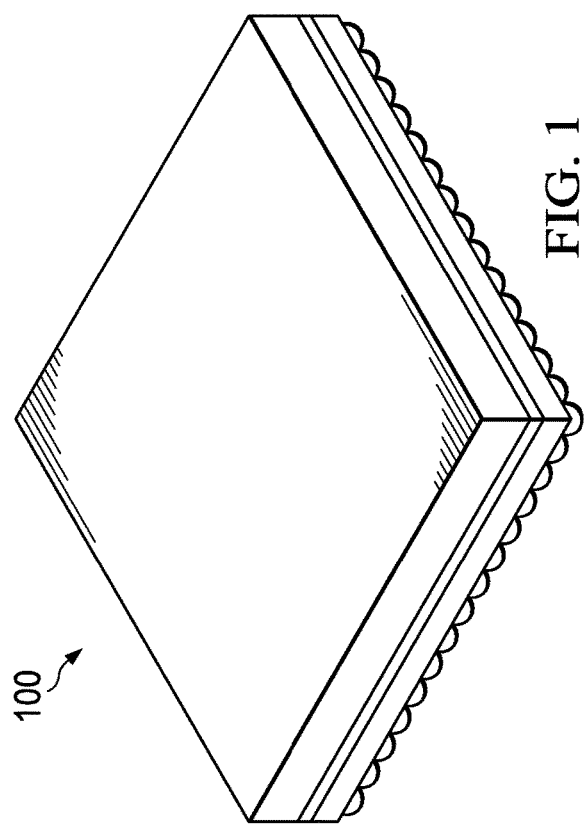
FIG. 1 is a projection view of a packaged semiconductor device.

Corresponding numerals and symbols in the different figures generally refer to corresponding parts unless otherwise indicated. The figures are not necessarily drawn to scale.

Elements may be described as "encapsulated" herein. When a semiconductor device is packaged with mold compound, the packaged semiconductor device is referred to as "encapsulated" and the process for molding may be referred to as "encapsulation." As used herein, when a semiconductor device die mounted on a substrate is described as encapsulated, portions of leads on the substrate remain uncovered to form package leads or terminals. The package leads or terminals allow both electrical connection and mechanical attachment of the packaged semiconductor device to a substrate in a system, such as a circuit board. Even though portions of the substrate leads remain uncovered by molding compound the packaged semiconductor device is described as "encapsulated" or it is described as being formed by encapsulation. For example, the exposed portion of the substrate leads may later be surface mounted to a printed circuit board in a piece of electronic equipment.

The term "solder mask" is used herein. Solder mask is a dielectric material that is applied to a substrate surface where solder will be used to make connections. The solder mask allows conductive traces on the surface of the substrate to be electrically isolated from the solder during a solder reflow process. Openings in the solder mask can be used to allow solder connections to conductive pads or lands on the substrate surface, with the solder mask surrounding the pads or lands to prevent solder from contacting other conductive portions of the substrate. The term "non-solder mask defined" (NSMD) is used herein. An NSMD opening is one where the opening in the solder mask layer is larger than the die pad area (so that the area that solder can be applied to is not defined by the NSMD opening diameter.) The solder mask does not contact the die pad or the sidewalls of the die pad, which is positioned in the center of the NSMD opening. The term "entire upper surface of the die pad" is used herein to describe the portion of the die pad exposed by a NSMD opening. The "upper surface" of the die pad is the surface facing away from the package substrate. The "entire upper surface" of the die pad includes all of the planar surface of the die pad. The term "solder mask defined" (SMD) is used herein. An SMD opening is formed with a diameter that is smaller than the corresponding die pad diameter, with the solder mask material overlying the outside periphery of the die pad, and the size of the die pad surface solder can contact is defined by the diameter of the solder mask opening, (hence the phrasing "solder mask defined.") The area that solder can contact on the die pad is the portion of the upper surface of the die pad that is exposed from the layer of solder mask material. SMD pads can have traces routed closer to the die pads (when compared to NSMD pads), because the SMD solder mask layer covers the periphery of the die pad and the sidewalls of the die pad, preventing solder applied to the die pad from forming a short to an adjacent conductive trace on the package substrate.

The term "conductive post connect" is used herein. As used herein, a conductive post connect is a structure made of a conductive material, for example copper or copper alloys, and that provides a connection between a semiconductor die and a package substrate. When the packaged semiconductor device is oriented with the semiconductor die positioned above the package substrate, the connection made is a vertical connection between the die pad and the bond pad of the semiconductor die. Some references describe the conductive post connect as a "controlled collapse chip connection" or as "C4" bumps. The conductive post connect includes a conductor material and a solder bump or ball at the exposed end. The conductive material remains intact after a solder reflow process, controlling the vertical spacing or controlling the "collapse" of the structure during solder reflow. A package substrate, such as a ball grid array (BGA) substrate, will have conductive portions formed as die pads on a die side surface, the die pads arranged in an array and aligned to electrically and mechanically connect to the conductive post connects. The conductive post connect can extend along the same direction as a conductive lead in the substrate, so that it appears as a rail or rectangle. Solder will be formed at the end of the conductive post connect. A copper pillar bump or copper bump is an example of a conductive post connect, the conductive post connect can also be a column, rectangle or rail shape, and can have an oval, round, or rectangular cross section. In examples, the conductive post connects can be arranged in parallel to one another with additional conductive post connects coupled to a common trace to provide a low resistance path between the die and the package. The conductive post connects can also transfer thermal energy away from the die to a package lead and out of the package. Solder is formed on the ends of the conductive post connects. The solder is used in a thermal reflow process to make a solder joint that is both a mechanical attachment and an electrical connection between the semiconductor die and the package substrate. Conductive post connects are used to form hundreds or thousands of connections between a semiconductor die and a substrate in fine pitch semiconductor packages.

In the arrangements, the problems of solder joint reliability and solder bridges between conductive post connects that occur when a semiconductor device die is flip chip mounted to a package substrate are solved by using a combination of SMD openings and NSMD openings in the solder mask layer at die pad locations on the package substrate. NSMD openings have a larger diameter opening in the solder mask than the diameter of the corresponding die pad, which allows the solder to flow down and around the sidewalls of the die pad during thermal reflow, preventing poor solder joint shapes and preventing solder bridging that occurs in some areas when SMD openings are used. In the arrangements, SMD openings at die pads can be used in non-critical areas of the package substrate, where solder joints failures are not observed or at die pad locations that are identified where solder joint failures are not likely to occur. These locations can be identified by using package simulation tools. The NSMD openings can be used in areas that are particularly critical, such as at die pad pattern edge boundaries, in outside corners of the die pad array, and in areas where experimental data or simulations indicate solder joint failures or solder bridging are likely to occur. In some arrangements, the NSMD openings in the solder mask may have sidewalls with sloped sides in the solder mask layer to further increase solder joint reliability. In alternative arrangements, the NSMD openings in the solder mask layer can have sidewalls that are normal to surface of the package substrate.

FIG. 1 illustrates a projection view of a packaged semiconductor device 100 that can be used with arrangements. In FIG. 1 a flip chip mounted semiconductor device die is packaged in a ball grid array package. This package is often referred to as a "BGA" or "FCBGA" package. Solder balls on a board side surface of the package substrate form the terminals for use in both mechanically mounting the packaged device to a system board, and for making electrical connections from the system to the semiconductor device. A package substrate (described below, not visible in FIG. 1) carries the solder balls on the board side surface, and carries the semiconductor device on an opposing die side surface. The body of the packaged semiconductor device 100 can be formed using epoxy mold compound (EMC), by use of another dielectric such as a room temperature liquid resin or epoxy that is then cured, alternatively a lid or cover can be used over the semiconductor device that is formed from polymers, metals, ceramics or combinations of metals, ceramics, and polymers. Heat slugs or heat transfer structures can be included within the molded body or inside the lid to transfer thermal energy from the semiconductor device die to the ambient atmosphere.

Figure 2:
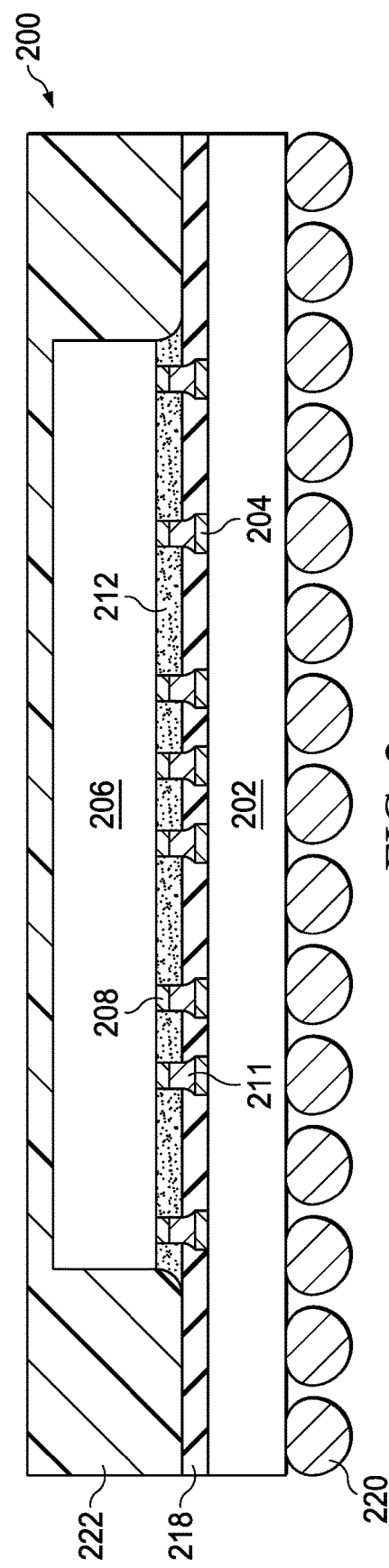
FIG. 2 is a cross sectional view of a flip chip ball grid array (FCBGA) packaged semiconductor device.

FIG. 2 is a cross sectional view of a flip chip ball grid array packaged semiconductor device, such as 100 in FIG. 1. In FIG. 2, similar reference labels are used for similar elements shown in FIG. 1, for clarity, for example packaged semiconductor device 200 corresponds to packaged semiconductor device 100 in FIG. 1. A semiconductor device die 206 is shown mounted with an active surface of the semiconductor device die facing the die mount side of a package substrate 202. The semiconductor device die can include transistors or other active devices such as diodes fabricated in the active surface using semiconductor processing. The semiconductor device die can be an integrated circuit with tens, thousands or more transistors forming a function. The semiconductor device die can be a single discrete transistor device such as a power FET transistor, or can be an analog circuit such as a rectifier, an A/D converter, an opto-coupler, a capacitor, a bridge, a photo sensor, and the like. The package substrate 202 can be an organic substrate. Useful FCBGA package substrates include laminates with a core similar to a printed circuit board or printed wiring board (PCB/PWB) and having multiple build-up layers on both the die mount side and the board side. The build-up layers are formed of dielectrics such as epoxy or resin, and conductive traces can be formed on both sides to act as signal redistribution layers (RDLs). Using conductive filled vias through the dielectric between the conductive trace layers, the package substrate can provide complicated routing of signals from the die mount side to the board side, and from die pads on the package substrate such as 204 to solder balls 220. Materials for BGA substrates include, as useful examples, fiber reinforced glass (FR-4) substrates, bismaleimide triazine (BT) epoxy substrates, tape and film substrates, flexible and rigid substrates. Ceramic, metal and plastic materials can be used with epoxy layers on both sides to form the conductor levels.

The solder balls 220 can be of any material used for solder or solder balls, including lead (Pb) containing and increasingly lead free (Pb-free) solder compounds. Eutectic compounds are desirable for solder, as the melting point is lower temperature for these compounds. Example Pb-free solders useful in the arrangements include tin-silver-copper (Sn—Ag—Cu or SAC) compounds, tin-copper (Sn—Cu) compounds and other eutectic compositions. Additional compounds using four elements can be used, such as tin-silver-copper-zinc (Sn—Ag—Cu—Zn) and tin-silver-copper-manganese (Sn—Ag—Cu—Mn). Any solder balls useful for semiconductor manufacturing can be used in the arrangements.

A solder mask layer 218 is formed on at least the die mount surface of the package substrate 202. The solder mask layer 218 can be formed of any useful solder mask or solder resist layer material. Useful examples include epoxy liquid, liquid photo-imageable solder mask (LPSM or LPI) inks, and dry-film photo-imageable solder mask (DFPSM). LPSM can be silkscreened or sprayed on the PCB, exposed to a lithographic pattern and developed to provide openings. Openings in the solder mask layer 218 expose the die pads on the package substrate, which are conductive pads for forming a solder joint. DFPSM is vacuum-laminated on the PCB then exposed and developed. Ink jet deposition, screen printing, and silk screening are all useful ways to deposit the solder mask material. Ink jet deposition is particularly efficient at use of material with precise placement, reduced need for clean up, and reduced waste. Solder mask material can be thermally cured, or in some cases, can be UV cured.

Die pads 204 are conductive pads formed on the package substrate to enable a solder joint and electrical connection to be made between the semiconductor device die 206 and the package substrate 202. At least a portion of the external surface of the die pads is exposed within openings in the solder mask. As is further described below, a conductive post connect carrying solder at the exposed end is placed on the die pad in the solder mask opening when the semiconductor device die 206 is mounted to the package substrate 202. A thermal reflow process then melts the solder which flows onto the die pads 204 and forms solder joints 211.

Semiconductor device die 206 has conductive post connects 208 extending from bond pads (not shown in FIG. 2 but described further herein below) on the active surface of the semiconductor device die. In an example, the conductive post connects can be copper pillars, copper pillar bumps, copper columns, copper rails, copper posts, or other conductive materials. Solder is formed on the ends of the copper posts. The conductive post connects and the solder can be referred to as a pillar bump or as a solder bump. As shown in FIG. 2, after a reflow process, the solder forms solder joints 211 on the die pads 204 of the package substrate 202.

After the solder joints 211 are formed, an underfill material 212 is dispensed between the semiconductor die 206 and the package substrate 202, surrounding conductive post connects 208 and surrounding the solder joints 211. Useful underfill materials include epoxies, acrylic and silicone materials. Filler particles can be used to enhance thermal conductivity and increase strength. Liquid underfill material can be flowed into the space between the semiconductor device die and the die mount surface of the package substrate, and then cured to a solid state.

Once the semiconductor die 206 is mounted to the package substrate 202, an encapsulation process can apply mold compound 222 over the semiconductor device die 206 and over at least a portion of the die mount surface of the package substrate 202. Thermoset mold compound such as epoxy resin can be used. Room temperature liquid mold compound can be used, or a solid epoxy resin can be melted and once liquid, transferred into a mold chase such as a transfer mold or block mold. After the mold compound cools it will be set and form the package body, providing moisture protection and mechanical strength to the packaged semiconductor device. Hermetic seals can be formed. In alternative arrangements, a lid or cover (not shown in this example) can be applied over the semiconductor device die 206 and affixed to the die mount surface of the package substrate 202. Metal and ceramic lids and covers can be used. Heat sinks can be mounted to the semiconductor die within the package or exterior to the semiconductor device package to increase thermal transfer.

Figure 3A:
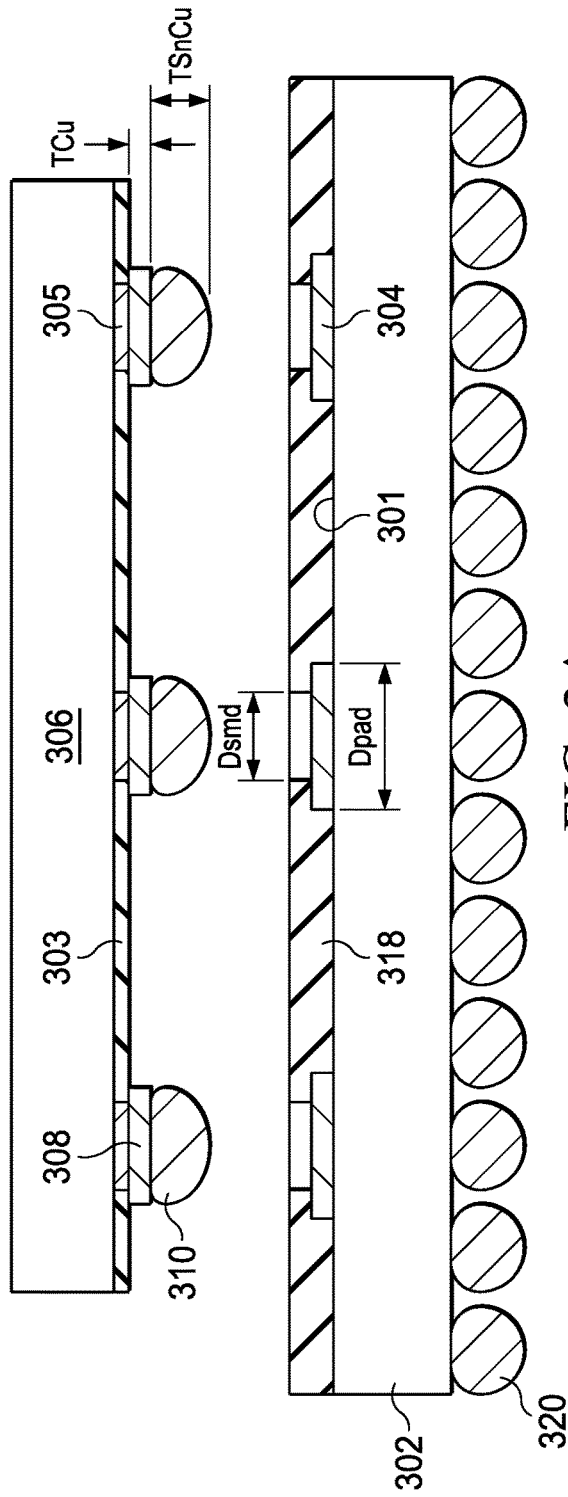
FIGS. 3A and 3B are cross sectional views of a semiconductor device die and a package substrate illustrating assembly of a packaged semiconductor device.
Figure 3B:
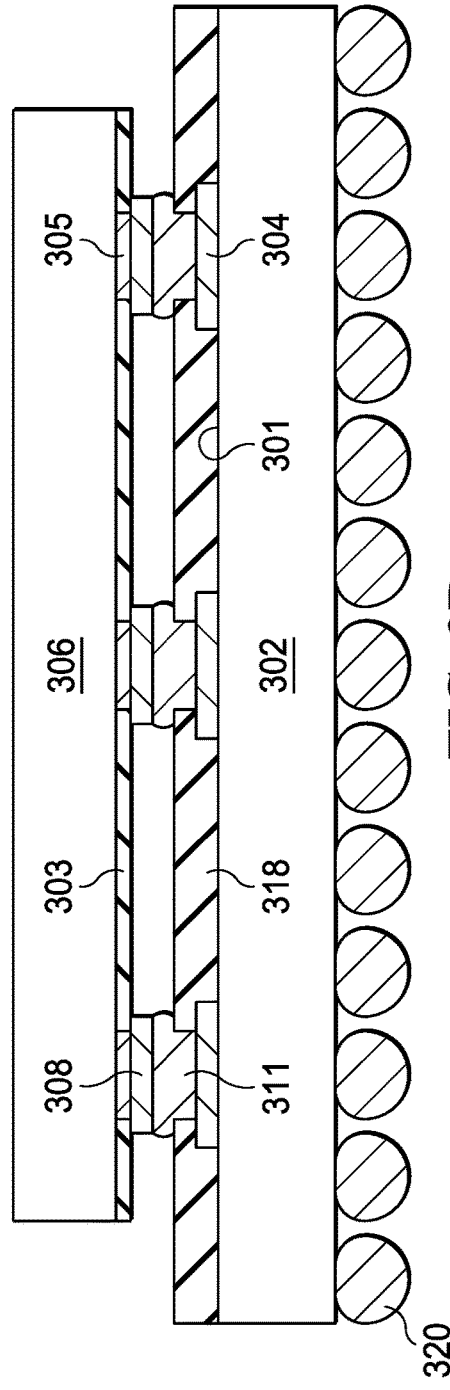

FIGS. 3A-3B illustrate in cross sectional views a semiconductor device die 306 being mounted to a package substrate 302 with SMD openings. In FIGS. 3A-3B, similar reference labels are used for elements similar to those shown in FIG. 2, for example semiconductor device die 306 corresponds to semiconductor device die 206 in FIG. 2.

In FIG. 3A, semiconductor device die 306 is shown arranged facing the die mount surface 301 of package substrate 302. Solder balls 320 are disposed on a board side surface of the package substrate 302 for use in surface mounting the packaged device to a system board or module (not shown). Semiconductor device die 306 has bond pads 305 formed on the active surface. The bond pads 305 can be of a conductor, for example aluminum, copper, or alloys of these, and the bond pads are electrically coupled to circuitry within semiconductor device die 306. Conductive post connects 308 are formed on and extend from the bond pads 305, which have exposed surfaces in openings in a passivation layer 303 that protects the semiconductor device die. The passivation layer 303 can be a polymer, polyimide, nitride or oxide layer. Underbump metallization (not shown for clarity of illustration) can be formed on the bond pads 305. Underbump metallization can include platings that improve adhesion and bonding between the bond pads and the conductive post connects, such as nickel, gold, palladium, silver or combinations or stacks of these. The underbump metallization is formed prior to the formation of the conductive post connects 308. In an example the conductive post connects are copper or copper alloy that is plated to a thickness Tcu of about 40 microns, other examples include copper plated from about 15 ums to about 100 ums. Electroplating and electroless plating can be used to form the copper pillars used as conductive post connects 308.

The conductive post connects 308 have a solder layer 310 plated on the ends. In an example the solder is a lead-free Sn—Cu solder having a thickness of about 25 ums. In other example the solder thickness can range from about 3 ums to about 40 ums. Other solders can be used.

To mount the semiconductor device die 306 to the package substrate 302 using a flip-chip mounting technology, the semiconductor device die 306 is arranged with the active surface positioned facing the package substrate 302, with the conductive post connects 308 aligned with openings in the solder mask layer 318 that correspond to the positions of die pads 304. As shown in FIG. 3A, these openings are solder mask defined (SMD) openings with a diameter Dsmd that is less than the diameter Dpad of the die pads 304, in one example the SMD opening diameter Dsmd is about 70 microns and the die pads have a diameter Dpad of about 100 microns. In other examples the width/diameter can vary. As shown in FIGS. 3A-3B, the SMD openings in the solder mask layer 318 are such that the solder mask layer 318 extends over the outer periphery of the die pads 304, so that only the central portion of the surface of die pads 304 exposed by the SMD opening is available for forming a solder joint. Any remaining solder must remain above the die pads 304 and between the semiconductor device and the package substrate after a thermal reflow process.

FIG. 3B shows the semiconductor device die 306 and the package substrate 302 after a reflow process to mount the semiconductor device die 306 to the package substrate 302. In FIG. 3B, the process is assumed to be ideal, so that when the semiconductor device 306 is mounted the solder (310 in FIG. 3A) forms uniform solder joints 311 on die pads 304. The die mounting is performed by bringing the solder ends of the conductive post connects in contact with the die pads and performing a thermal reflow process. In the thermal reflow process, the solder is heated to a melting point and allowed to flow onto the die pad surface and form a solder joint between the die pads 304 and the conductive post connects 308 in the SMD openings.

FIG. 3B shows the semiconductor device die 306 and the package substrate 302 after a reflow process to mount the semiconductor device die 306 to the package substrate 302. The die mounting is performed by bringing the solder ends of the conductive post connects 308 into contact with the die pads 304 on the package substrate 302. In FIG. 3B, solder joints 311 are formed after the solder melts and reflows onto the die pads 304. Once the die 306 is mounted to package substrate 302, additional processing will be performed to complete the package, including application of an underfill material (not shown in FIG. 3, see FIG. 2) between the semiconductor die 306 and package substrate 302, and encapsulation or mounting a cover, as described above with respect to FIG. 2.

The thermal reflow process requires temperatures in excess of 220° C. for a minimum time such as 80-90 seconds or longer. The packaged device is then cooled or allowed to cool, to allow the solder to solidify and complete the solder joints 311.

Materials in the semiconductor device dies and the package substrate have different and quite dissimilar coefficient of thermal expansion (CTE) characteristics. For example a silicon die has a CTE of about 3 ppm/° C., while substrate materials have CTE in the range of about 11-13 ppm/° C. As the device cools after thermal reflow, these CTE mismatches cause stress and strain on the solder joints and this can create failure situations.

Figure 4A:
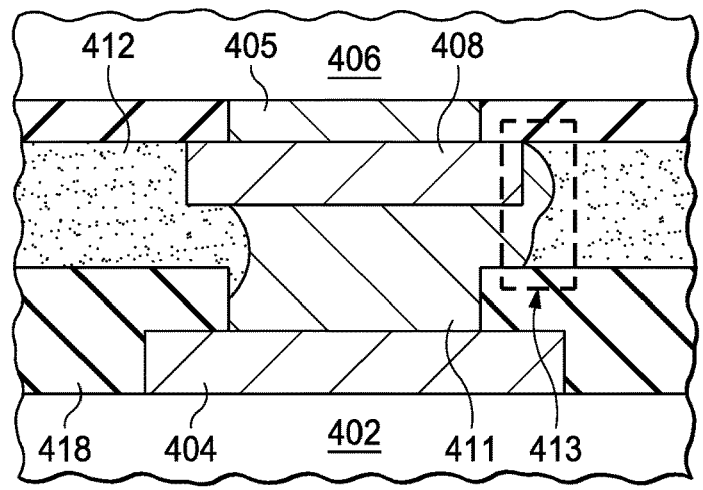
FIGS. 4A-4C are cross sectional views of solder joints formed between a semiconductor device die and a package substrate, illustrating problems that can occur in assembly of a packaged semiconductor device.
Figure 4B:
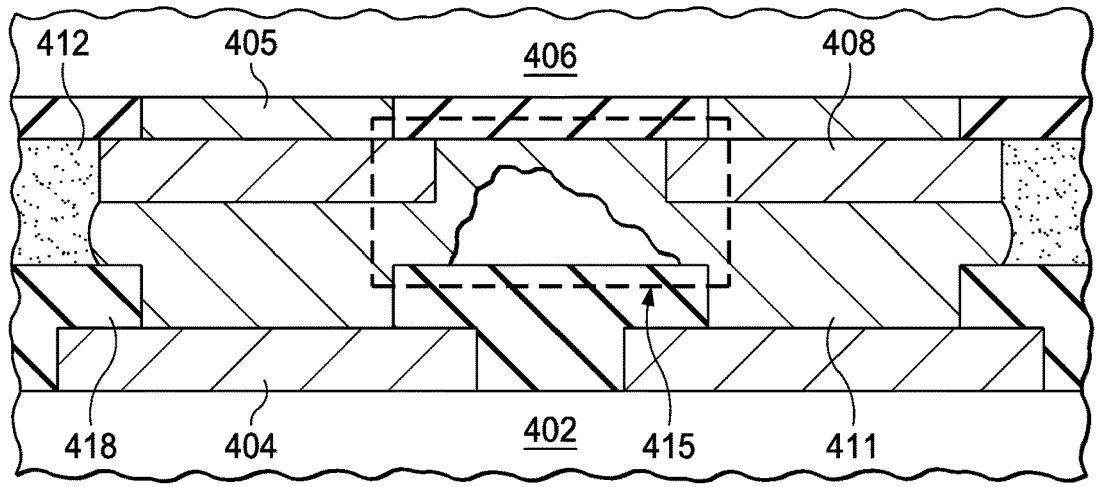
Figure 4C:
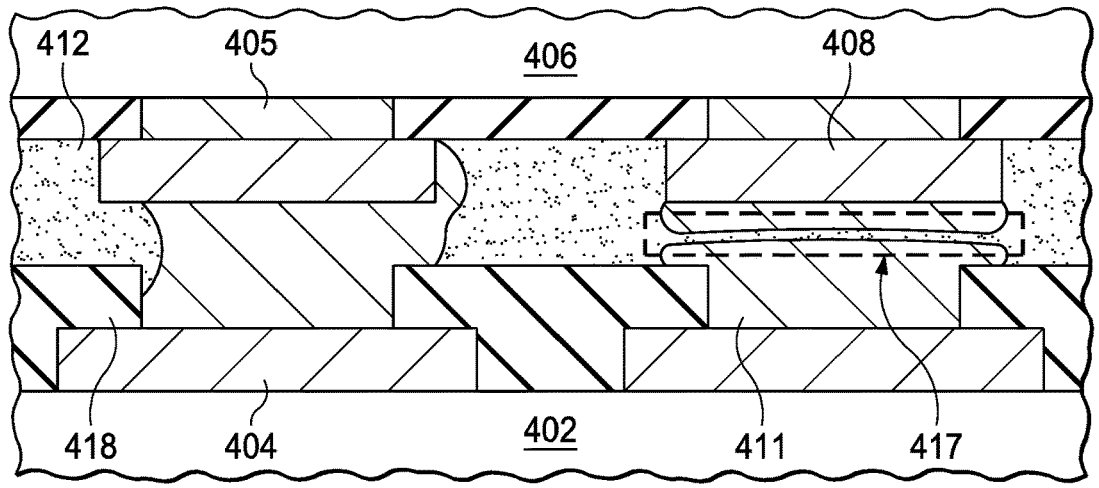

FIGS. 4A-4C illustrate in cross sectional views some failure types that have been observed in solder joints when a semiconductor device die is flip chip mounted to a package substrate with SMD openings at the die pad locations. In FIGS. 4A-4C, similar reference labels are used for similar elements in FIGS. 3A-3B, for example semiconductor device die 406 corresponds to semiconductor device die 306.

In FIG. 4A, a sidewall wetting situation is shown. A conductive post connect 408 extends from the bond pad 405 on semiconductor device die 406. During die mount and thermal reflow processes, the solder joint 411 forms but some solder cannot flow to the die pad 404 on package substrate 402, due to the SMD opening in solder mask layer 418. The amount of solder that can flow is limited by the SMD opening and some of the solder in this example is displaced and wets the sidewall of the conductive post connect, as shown in region 413, here the conductive post connect is a copper pillar. The solder flowed up along the sidewall of the conductive post connect 408 instead of wetting the die pad 404. This can create a weak solder joint 411 as now the solder volume available to form the solder joint is reduced between the end of the conductive post connect 408 and the surface of the die pad 404. Further delamination problems can occur as the underfill material 412 may not adhere well to the solder 411 along the side of the conductive post connect 408. Adhesion has been shown to be poor between underfill materials and solder (when compared to the adhesion that would result between the underfill material and the metal sidewall of the conductive post connect.) See "Mold Compound Adhesion to Bare Copper Lead Frames—Effect of Laser Texturing", International Journal of Microcircuits and Electronic Packaging, Vol. 25, No. 1, First Quarter, (2002), pp. 51-79, which is hereby incorporated by reference in its entirety; mold compound adhesion is described at pp. 53-54.

FIG. 4B illustrates a situation where the solder joint 411 is displaced along the side of the conductive post connect 408 for two adjacent conductive post connects, so that a solder bridge or short (shown in region 415) forms between the conductive post connects. The short or solder bridge also displaces underfill material 412 from making contact to the sidewalls of the conductive post connects in region 415, creating a possible delamination issue. A void can occur, as shown, because the solder has prevented the underfill from properly filling between the conductive post connects.

FIG. 4C illustrates a non-wet failure where the solder joint 411 for a SMD opening on a conductor in the substrate 402 is incomplete. As shown in region 417, the conducive post connect 408 has an open between it and the die pad 404 after the solder joint 411 is formed. This occurs because the solder cannot flow into the SMD opening, and during reflow the solder flows elsewhere, reducing the solder volume in between the conductive post connect 408 and the die pad 404, and resulting in a void or crack, a non-wet of the conductive post connect. An open or highly resistive electrical path results, which will fail at device test, resulting in a scrapped packaged part.

FIGS. 5A-5D illustrate in a series of cross sectional views steps of assembling a packaged semiconductor device using features of an arrangement. In FIGS. 5A-5D, similar reference labels are used for elements similar to those in FIG. 2, for example semiconductor device die 506 corresponds to semiconductor device die 206.

Figure 5A:
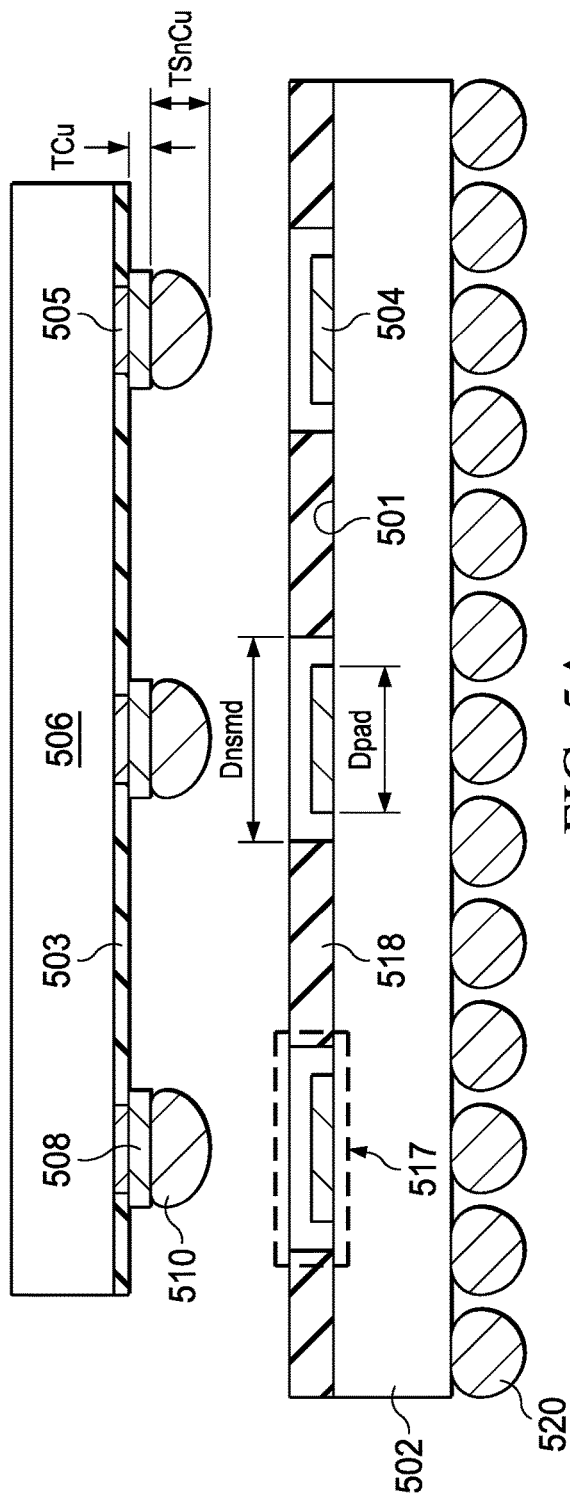
FIGS. 5A-5D are a series of cross sectional views illustrating assembly of a packaged semiconductor device of an arrangement.

In FIG. 5A a semiconductor device die 506 is shown positioned with the active surface facing the die mount surface 501 of package substrate 502 that has a die mount surface 501 and an opposite board side surface carrying solder balls 520. The die pads 504 are exposed from the solder mask layer 518 by non-solder mask defined (NSMD) openings, see region 517. In examples the NSMD openings can be 110 microns+/−10 microns in diameter. In contrast to the SMD openings of FIGS. 3A-3B, in NSMD openings the solder mask layer 518 does not contact or overly any portion of the die pads 504. The entire upper surface (as oriented in FIG. 5A) of the die pads 504, the surface facing away from the package substrate 502, is exposed by the NSMD openings. Semiconductor device die 506 has bond pads 505, which have exposed surfaces in openings in a passivation layer 503 that protects the semiconductor device die 506, with conductive post connects 508 extending from the bond pads 505, and solder 510 at the ends of the conductive post connects 508. In the NSMD opening, the diameter of the opening in the solder mask (Dnsmd) is greater than the diameter of the die pads (Dpad) and the solder mask layer 518 does not contact the sidewalls of the corresponding die pads 504. (Compare this to the diameter Dsmd in FIG. 3A, which is less than the die pad diameter Dpad.) NSMD openings useful with the arrangements can have diameters from about 100 to about 120 microns. The NSMD openings will be greater than the die pad diameters by about 5 to 10 microns to form spacing around the die pads, so that the solder mask layer 518 does not contact the die pads 504.

Figure 5B:
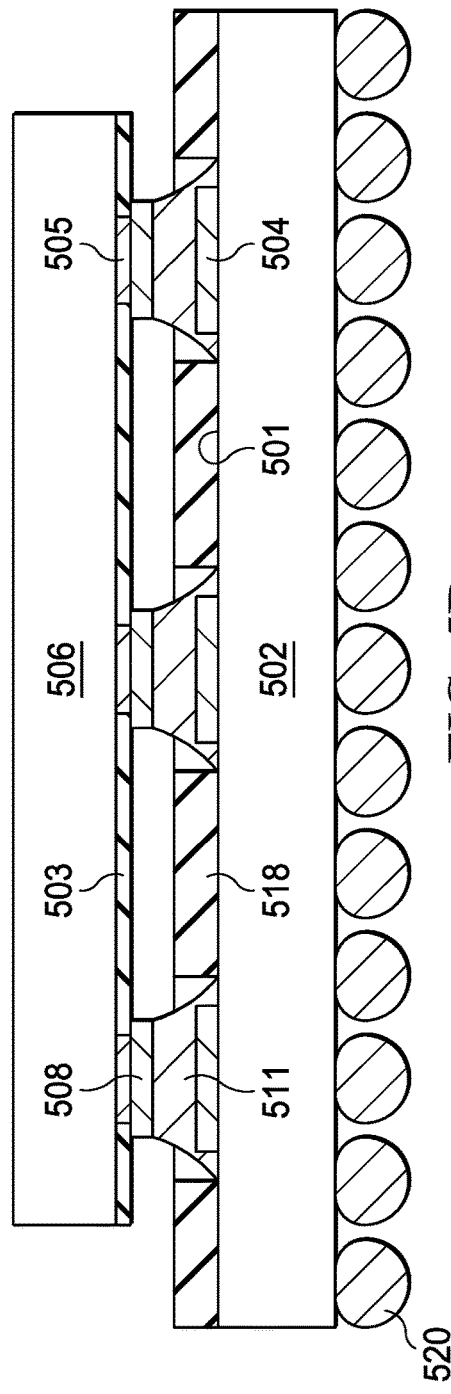

FIG. 5B illustrates the semiconductor device die 506 after the thermal reflow process is performed to mount the die 506 to the package substrate 502. Solder joints 511 are formed after the thermal reflow melts the solder (see 510 in FIG. 5A) and it flows onto the die pads 504. In contrast to the example where SMD openings were used at the die pads shown in FIGS. 3A-3B, when NSMD openings are used as in FIGS. 5A-5D, the solder can flow over the peripheral sides of the die pads 504 and into the space between the sides of the die pads 504 and the sidewalls of solder mask 518 at the NSMD defined openings. The solder then contacts the die pads on the surface of die pads 504 and on the sidewalls of the die pads, as well as the end of the conductive post connects 508, to form reliable solder joints. Because the solder can flow into a larger area around the die pads, the solder does not wick up the sides of the conductive post connects, and the possibility of solder bridges forming such as shown in FIG. 4B is reduced or eliminated. Also, the volume of solder that surrounds the die pads is greater and in the correct place, so that non-wets such as the situation shown in FIG. 4C are less likely to occur.

Figure 5C:
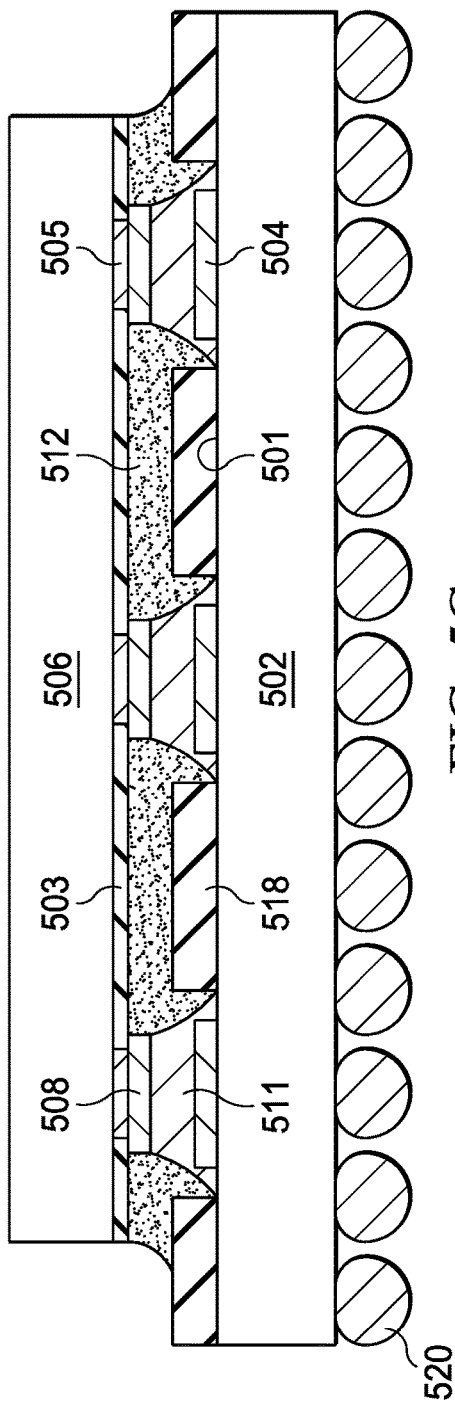

FIG. 5C illustrates in a cross section the semiconductor device die 506 and package substrate 502 as shown in FIG. 5B after the underfill material 512 is dispensed between the passivation layer 503 of semiconductor die 506 and the die mount surface 501 of the package substrate 502. The underfill material 512 is cured to form a mechanical support for the solder joints 511.

Figure 5D:
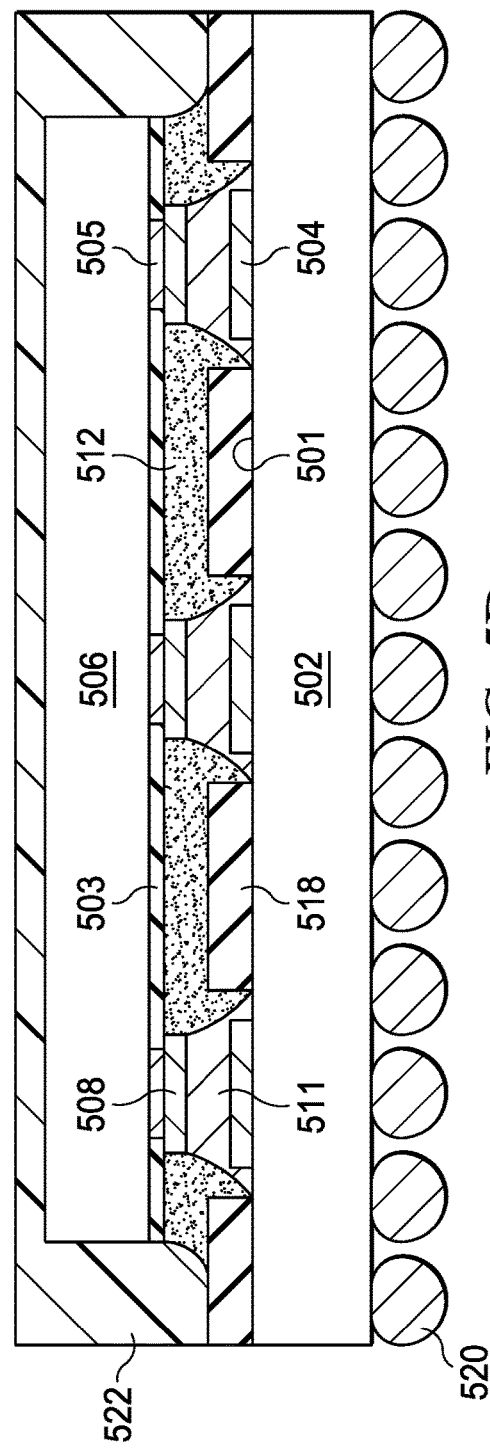

FIG. 5D illustrates in a cross section the semiconductor die 506 and package substrate 502 after an encapsulation process encapsulates the semiconductor device die 506 in mold compound 522.

Figure 5E:
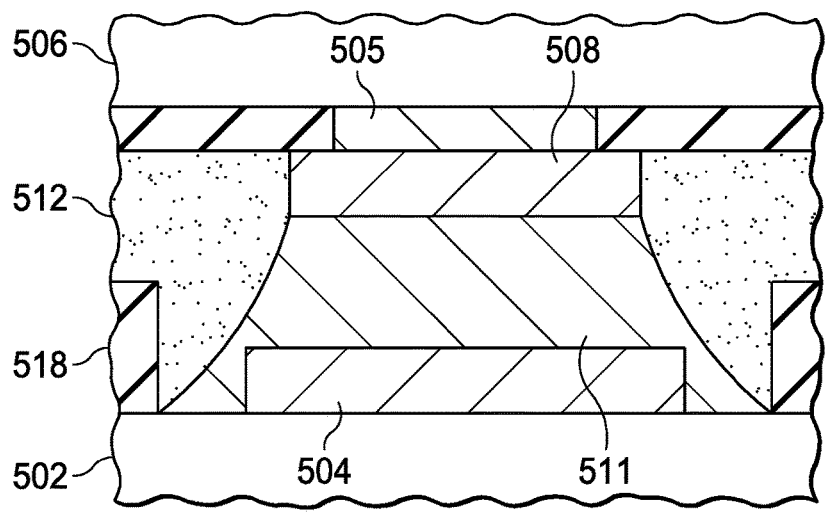
FIG. 5E is a close up cross sectional view of a solder joint in an arrangement.

FIG. 5E illustrates in a close up, partial cross section the solder joint 511 formed between the semiconductor device die 506 and the package substrate 502 using the NSMD openings of the arrangements. In FIG. 5E, the solder forms a joint between the end of the conductive post connect 508 and the die pad 504, and solder is formed around the sidewalls of die pad 504, filling the space between the sidewalls in the opening of solder mask 518 and the sidewalls of die pad 504. No solder is shown on the sidewalls of the conductive post connect 508, in this example a copper pillar, and the underfill 512 is in contact with the sidewalls of conductive post connect 508, improving adhesion of the underfill material.

Figure 6A:
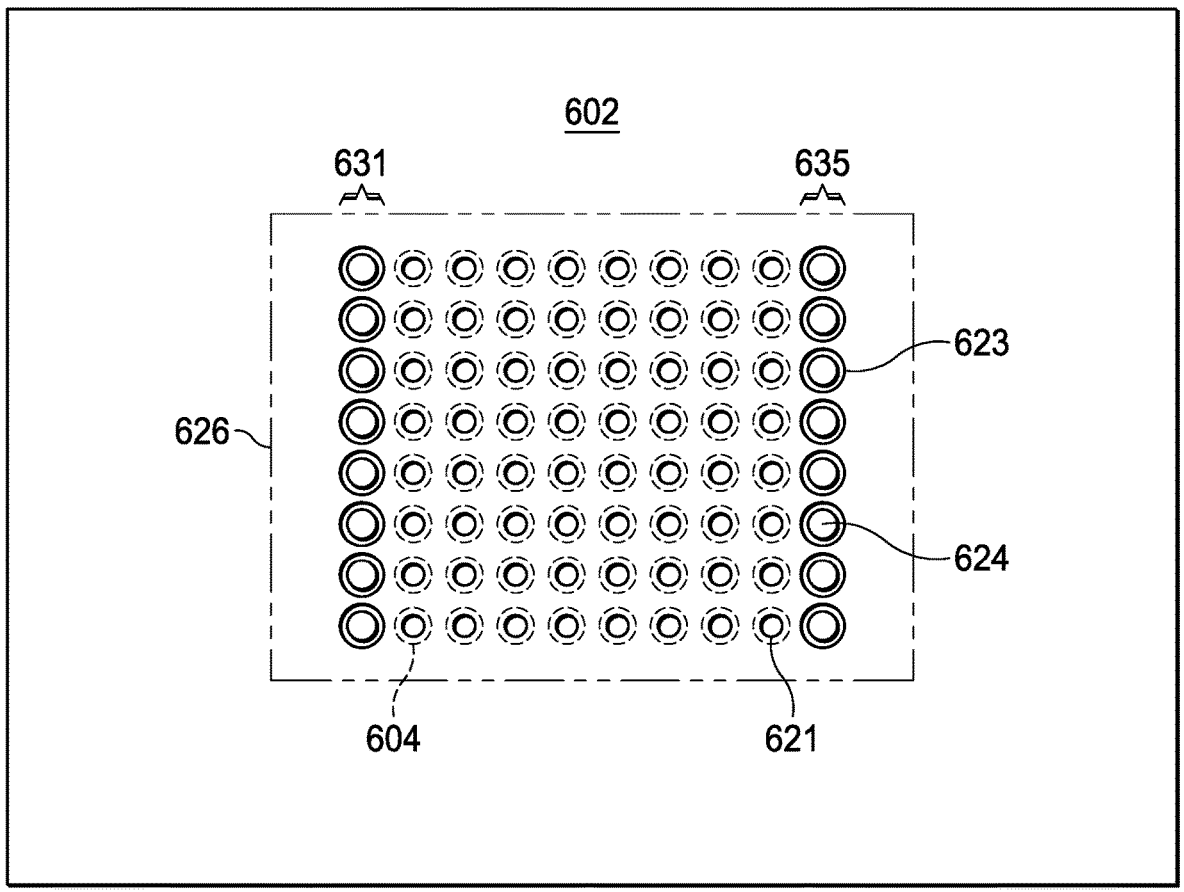
FIG. 6A is a plan view of a package substrate of an arrangement.
Figure 6B:
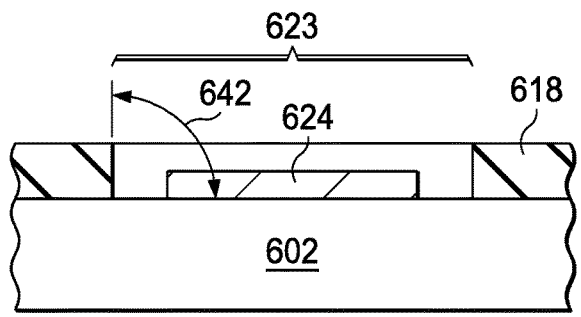
FIGS. 6B and 6C are cross sectional views of a non-solder mask defined pad opening and a corresponding die pad used in example arrangements.
Figure 6C:
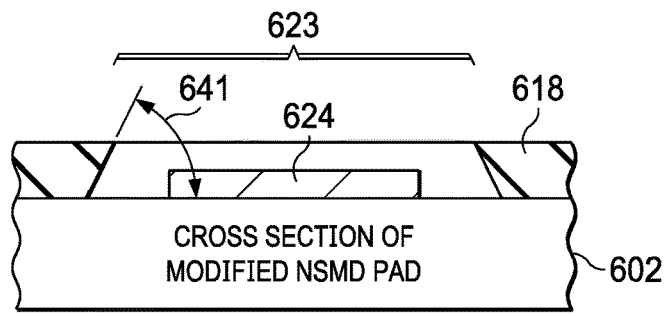

FIGS. 6A-6C illustrate in a plan view and two cross section views an arrangement using both SMD and NSMD openings on a package substrate. In FIGS. 6A-6C, similar reference labels are used for similar elements as in FIG. 2, for example package substrate 602 corresponds to package substrate 202 in FIG. 2.

FIG. 6A is a plan view looking onto the die mount surface of a package substrate 602. Package substrate 602 has a surface covered in a solder mask layer (see 618 in FIG. 6B). SMD openings 621 expose the upper surface of die pads 604, which are arranged in an array of rows and columns. Note that while the die pads 604 are aligned between adjacent columns and rows, in alternative arrangements, the die pads can be staggered to further reduce pitch between pads. The die pads 604 correspond to the conductive post connects for a semiconductor device die that will be mounted to the package substrate (not shown, but see element 506 in FIG. 5A for example). NSMD openings 623 expose additional die pads 624. Outline 626 indicates the outside edge of the semiconductor device die (not shown) that will be mounted to package substrate 602.

In the arrangement of FIG. 6A, the array of die pads includes both SMD openings 621 exposing portions of the upper surface of die pads 604 and NSMD openings 623 exposing the entire upper surface of die pads 624. The NSMD openings are only placed in columns 631, 635, which are at the outside edges of the array of die pads. In alternative arrangements, the NSMD openings and corresponding die pads can be placed only at the exterior corner positions of the array of die pads. In additional alternative arrangements, the NSMD openings and corresponding die pads can be placed only at the most critical die pad positions, such as the die pads having the greatest distance to the neutral point (DNP) of the array of die pads, which can be the outside rows or columns, the corners, or some other positions. In addition, automated design tools including Finite Element Analysis can be used to identify those die pad positions for a particular semiconductor device and package substrate that are most likely to fail due to solder joint or CTE stress and strain issues, and the NSMD die pads can be used only at those die pad positions, to increase reliability and reduce failures. In the arrangements at least one NSMD opening is used in the array of solder mask openings, while the remaining openings are SMD openings. SMD openings are generally preferred for providing more area for trace routing on the die mount surface of the package substrate. The spacing of the solder mask layer away from the die pad in the NSMD openings requires additional area that cannot be used for trace routing (NSMD opening require additional board area when compared to an SMD opening).

FIG. 6B illustrates in a cross sectional view an example NSMD opening 623 at a die pad location on the package substrate 602 that can be used in an arrangement. In FIG. 6B, die pad 624 corresponds to a die pad 624 in FIG. 6A. In the example of FIG. 6B, the opening 623 has vertical sidewalls, so that an angle labeled 642 formed at the intersection of the die mount surface of the package substrate 602 and the sidewall of solder mask 618 forms a right angle. Anisotropic etching can be used to form the vertical sidewalls of solder mask 618.

FIG. 6C illustrates in a cross sectional view an example NSMD opening for use with the arrangements with sloped sidewalls. In FIG. 6C, the opening 623 in solder mask 618 is spaced from the die pad 624, with the sidewalls sloping away from the sidewalls of die pad 624 so that the diameter of the opening 623 is larger at the bottom part (as oriented in FIG. 6C, the bottom is the part adjacent the package substrate 602) than at the top part. By forming an opening in the solder mask wider at the bottom to expose additional area around the bottom of the die pad 624, the solder has additional area to flow into during reflow, improving the quality of the resulting solder joint over the arrangement in FIG. 6B. While both shapes for NSMD openings are useful with the arrangements, the NSMD opening in FIG. 6C has somewhat better performance. The angle at the intersection of the sidewall surface of solder mask 618 and the die mount surface of the substrate 602, labeled 641, is an acute angle less than 90 degrees, and in examples ranges between 65 and 80 degrees.

Figure 7:
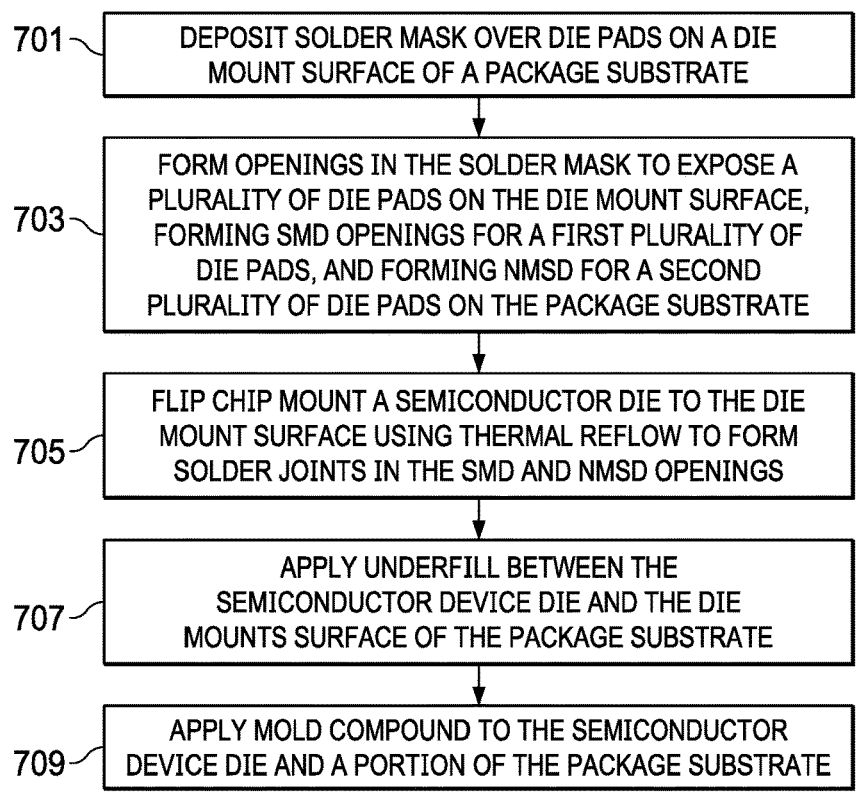
FIG. 7 is a flow chart illustrating the steps of a method arrangement.

FIG. 7 illustrates in a flow chart the major steps for forming a packaged semiconductor device using the arrangements. In step 701 a solder mask layer is deposited on a package substrate having an array of die pads on a die mount surface. The die pad positions correspond to conductive post connect positions on a semiconductor device die to be mounted to the package substrate.

At step 703, openings are formed in the solder mask layer to expose the die pads on the package substrate. A plurality of the openings are SMD openings, with the solder mask layer overlying a portion of the die pads, and covering the sidewalls of the die pads, so that the opening in the solder mask layer has a diameter that is less than the diameter of the die pads. At least one of the openings is an NSMD opening, with the solder mask spaced from the sidewalls of the die pad and the sidewalls of the die pad exposed in the opening, so that the opening in the solder mask layer has a diameter that is greater than the diameter of the die pad.

As described above, the NSMD openings can be formed at die pad locations that are determined to be critical locations for solder joint reliability. For example the NSMD openings can be formed at exterior corner locations, at edge rows or edge columns, and at additional locations that are considered critical areas, such as maximum DNP locations. Simulations, Finite Element Analysis, or experiments can be performed to identify die pad locations that are most likely to have solder joint issues. Those die pad locations can then be designated as NSMD opening locations.

At step 705, a semiconductor device die is flip chip mounted to the package substrate, and a thermal reflow process is used to form solder joints between the conductive post connects of the semiconductor device die and the die pads in the openings in the solder mask layer.

At step 707, underfill material can be applied between the semiconductor device die and the die mounts surface of the package substrate.

At step 709, mold compound (for example, EMC) can be applied over the semiconductor device die and at least a portion of the die mount surface of the package substrate. The package substrate can include solder balls on a board side opposite the die mount surface, for example. In alternative arrangements, a lid or cover can be attached to the package substrate that covers the semiconductor device die. Heat sinks, heat slugs or other thermal transfer elements can be placed in contact with the semiconductor device die within the package body, or can be applied externally to the packaged device. A hermetic seal can be formed to further protect the semiconductor device die and the package substrate.

Modifications possible in the described arrangements and other alternative arrangements are possible within the scope of the claims.

What is claimed is:

1. An apparatus comprising:
a package substrate having a die mount surface;
an array of die pads arranged in rows and columns in a first region of the die mount surface, wherein the array of die pads includes:
a first column of die pads defining and being coextensive with a first boundary of the array;
a second column of die pads defining and being coextensive with a second boundary of the array opposite the first boundary;
a first row of die pads defining and being coextensive with a third boundary of the array perpendicular to the first boundary; and
a second row of die pads defining and being coextensive with a fourth boundary of the array opposite the third boundary, wherein the first, second, third, and fourth boundaries define the first region, and wherein a second region of the die mount surface outside the first, second, third and fourth boundaries is exclusive of die pads;
a solder mask layer overlaying the die mount surface; and
openings extended through the solder mask layer, wherein the openings include:
a plurality of solder mask defined (SMD) openings at a plurality of die pad locations corresponding to a plurality of die pads of the array, each of the SMD openings exposing a portion of a surface of a corresponding die pad, the surface facing away from the package substrate; and
a first column of non-solder mask defined (NSMD) openings at die pad locations, each one of the die pads of the first column of die pads respectively aligning with a corresponding one of the NSMD openings of the first column of NSMD openings, each of the NSMD openings exposing an entire surface of a corresponding die pad and sidewalls of the die pad.

2. The apparatus of claim 1, further comprising:
a semiconductor device die with a first surface and having conductive post connects extending from bond pads on the first surface;
wherein the semiconductor device die is mounted to the die mount surface of the package substrate by solder joints formed between the die pads of the array and the conductive post connects, the solder joints extending through the openings in the solder mask layer.

3. The apparatus of claim 1, further comprising:
a plurality of NSMD openings at die pads corresponding to one or more exterior corner locations of the array of die pads.

4. The apparatus of claim 1, wherein the openings include a second column of NSMD openings corresponding to the second column of die pads, each of the second column of NSMD openings exposing an entire surface of a corresponding die pad and sidewalls of the die pad.

5. The apparatus of claim 1, wherein at least one of the first column of NMSD openings comprises sidewalls in the solder mask layer, the sidewalls intersecting the die mount surface of the package substrate at a right angle.

6. The apparatus of claim 1, wherein at least one of the first column of NMSD openings comprises sidewalls in the solder mask layer, the sidewalls intersecting the die mount surface of the package substrate at an acute angle such that the at least one of the first column of NSMD openings is wider proximate the die mount surface of the package substrate than proximate a top surface of the solder mask layer.

7. The apparatus of claim 1, wherein at least one of the first column of NMSD openings comprises sidewalls in the solder mask layer, the sidewalls intersecting the die mount surface of the package substrate at an angle between 60 and 80 degrees.

8. The apparatus of claim 1, wherein the die pads have a first diameter, the SMD openings have a second diameter less than the first diameter, and the NSMD openings have a third diameter greater than the first diameter.

9. The apparatus of claim 1, wherein the NSMD openings have sidewalls spaced from sidewalls of the die pads, a first diameter at a surface of the solder mask layer that faces away from the package substrate, and a second diameter where the NSMD openings meet the die mount surface, the first diameter less than the second diameter.

10. A method for manufacturing a packaged semiconductor device, comprising:
    forming an array of die pads in rows and columns in a first region of a die mount surface of a package substrate, wherein the array of die pads includes:
        a first column of die pads defining and being coextensive with a first boundary of the array;
        a second column of die pads defining and being coextensive with a second boundary of the array opposite the first boundary;
        a first row of die pads defining and being coextensive with a third boundary of the array perpendicular to the first boundary; and
        a second row of die pads defining and being coextensive with a fourth boundary of the array opposite the third boundary, wherein the first, second, third and fourth boundaries define a first region, and wherein a second region of the die mount surface outside the first, second, third and fourth boundaries is exclusive of die pads;
    forming a solder mask layer over the array of die pads; and
    forming openings extended though the solder mask layer, wherein the openings include:
        a plurality of solder mask defined (SMD) openings having a first diameter that is less than a second diameter of the die pads; and
        a first column of non-solder mask defined (NSMD) openings at die pad locations, each one of the die pads of the first column of die pads respectively aligning with a corresponding one of the NSMD openings of the first column of NSMD openings, each of the NSMD openings having a third diameter that is greater than the second diameter of the die pads.

11. The method of claim 10, further comprising:
    flip chip mounting a semiconductor device die to the die mount surface of the package substrate, the semiconductor device die having a plurality of conductive post connects extending from bond pads on a first surface of the semiconductor device die and each conductive post connect having solder at an end portion; and
    forming solder joints between the conductive post connects of the semiconductor device die and the die pads of the package substrate using a thermal reflow process, wherein the solder joints extend through the openings in the solder mask layer.

12. The method of claim 10, further comprising:
    forming NSMD openings at locations corresponding to one or more exterior corner locations in the array of die pads.

13. The method of claim 10, further comprising:
    forming a second column of NSMD openings, each of the second column of NSMD openings having the third diameter.

14. The method of claim 10, further comprising:
    forming NSMD openings at locations in the array of die pads that are selected at one or more of the first and second boundaries.

15. The method of claim 10, wherein at least one NSMD opening of the first column of NSMD openings has sidewalls that are spaced from sidewalls of a corresponding die pad, the solder mask layer having sidewalls that intersect with the die mount surface of the package substrate at a right angle.

16. The method of claim 10, wherein at least one NSMD opening of the first column of NSMD openings has sidewalls that are spaced from sidewalls of a corresponding die pad, the solder mask layer having sidewalls that intersect with the die mount surface of the package substrate at an acute angle such that the at least one of the first column of NSMD openings is wider proximate the die mount surface of the package substrate than proximate a top surface of the solder mask layer.

17. A packaged semiconductor device, comprising:
    a package substrate having a die mount surface;
    an array of die pads arranged in rows and columns in a first region of the die mount surface, wherein the array of die pads includes:
        a first column of die pads defining and being coextensive with a first boundary of the array;
        a second column of die pads defining and being coextensive with a second boundary of the array opposite the first boundary;
        a first row of die pads defining and being coextensive with a third boundary of the array perpendicular to the first boundary; and
        a second row of die pads defining and being coextensive with a fourth boundary of the array opposite the third boundary, wherein the first, second, third and fourth boundaries define a first region, and wherein a second region of the die mount surface outside the first, second, third and fourth boundaries is exclusive of die pads;
    a solder mask layer overlaying the die mount surface; and
    openings extending through the solder mask layer, wherein the openings include:
        a plurality of solder mask defined (SMD) openings in the solder mask layer at a plurality of die pad locations corresponding to a plurality of die pads of the array, each of the SMD openings exposing a portion of a surface of a corresponding die pad;
        a first column of non-solder mask defined (NSMD) openings at die pad locations, each one of the die pads of the first column of die pads respectively aligning with a corresponding one of the NSMD openings of the first column of NSMD openings, each of the NSMD openings exposing an entire surface of a corresponding die pad and sidewalls of the die pad; and
    a semiconductor device die with a first surface and having conductive post connects extending from bond pads on the first surface, the conductive post connects coupled to the die pads of the array by solder joints extending through the openings in the solder mask layer.

18. The packaged semiconductor device of claim 17, further comprising:
    a plurality of NSMD openings located at die pad locations corresponding to one or more exterior corner locations of the array of die pads.

19. The packaged semiconductor device of claim 17, further comprising:
one or more NSMD openings located at die pad locations that are selected at one or more of the first and second boundaries.

20. The packaged semiconductor device of claim 17, wherein at least one NSMD opening of the first column of NSMD openings has sidewalls that are spaced from sidewalls of a corresponding die pad, the solder mask layer having sidewalls that intersect with the die mount surface of the package substrate at a right angle.

21. The packaged semiconductor device of claim 17, wherein at least one NSMD opening of the first column of NSMD openings has sidewalls that are spaced from sidewalls of a corresponding die pad, the solder mask layer having sidewalls that intersect with the die mount surface of the package substrate at an acute angle such that the at least one of the first column of NSMD openings is wider proximate the die mount surface of the package substrate than proximate a top surface of the solder mask layer.

22. The packaged semiconductor device of claim 17, further comprising:
a plurality of solder balls on a board side surface of the package substrate opposite the die mount surface.

23. The packaged semiconductor device of claim 22, further comprising:
an encapsulation mold compound covering the semiconductor device die and at least a portion of the die mount surface of the package substrate.

24. The packaged semiconductor device of claim 17, wherein at least one of the NSMD openings of the first column of NSMD openings is filled with a portion of the solder joints and a portion of an underfill material disposed between the semiconductor device die and the solder mask layer.

25. The apparatus of claim 2, wherein at least one of the NSMD openings of the first column of NSMD openings is filled with a portion of the solder joints and a portion of an underfill material disposed between the semiconductor device die and the solder mask layer.

* * * * *